United States Patent
Shibayama

(10) Patent No.: US 10,853,445 B2
(45) Date of Patent: Dec. 1, 2020

(54) DIGITAL FILTER DEVICE, DIGITAL FILTERING METHOD, AND PROGRAM RECORDING MEDIUM

(71) Applicant: NEC Corporation, Minato-ku, Tokyo (JP)

(72) Inventor: Atsufumi Shibayama, Tokyo (JP)

(73) Assignee: NEC CORPORATION, Tokyo (JP)

( * ) Notice: Subject to any disclaimer, the term of this patent is extended or adjusted under 35 U.S.C. 154(b) by 77 days.

(21) Appl. No.: 16/091,159

(22) PCT Filed: Apr. 14, 2017

(86) PCT No.: PCT/JP2017/015211
§ 371 (c)(1),
(2) Date: Oct. 4, 2018

(87) PCT Pub. No.: WO2017/183563
PCT Pub. Date: Oct. 26, 2017

(65) Prior Publication Data
US 2019/0129913 A1     May 2, 2019

(30) Foreign Application Priority Data
Apr. 19, 2016   (JP) .................. 2016-083336

(51) Int. Cl.
*G06F 17/14* (2006.01)
*H03H 17/02* (2006.01)

(52) U.S. Cl.
CPC ............ *G06F 17/14* (2013.01); *G06F 17/142* (2013.01); *H03H 17/0213* (2013.01); *H03H 17/0235* (2013.01)

(58) Field of Classification Search
CPC ...... G06F 17/14; G06F 17/141; G06F 17/142; G06F 17/144; G06F 17/145;
(Continued)

(56) References Cited

U.S. PATENT DOCUMENTS 5,216,516 A * 6/1993 Tanaka .................. G06F 17/147
375/E7.093
5,539,836 A * 7/1996 Babkin ................. G06F 17/147
382/250
(Continued)

FOREIGN PATENT DOCUMENTS

EP      0 813 301 A1    12/1997
JP       08137832 A      5/1996
(Continued)

OTHER PUBLICATIONS

English translation of WO 2015045310 (Year: 2015).*
(Continued)

*Primary Examiner* — Andrew Caldwell
*Assistant Examiner* — Emily E Larocque

(57) ABSTRACT

In order to reduce a circuit scale and power consumption while maintaining filter performance, a digital filter device includes a first transform circuit for executing a first transform process on data in a predetermined frequency range; a filtering circuit for executing a filtering process by setting an operation bit width of data of a preset first frequency component among the data, on which the first transform process was executed by the first transform circuit, to a different bit width from bit widths of other frequency components; and a second transform circuit for executing a second transform process on the data on which the filtering process was executed by the filtering circuit.

6 Claims, 13 Drawing Sheets

(58) Field of Classification Search
CPC ... G06F 17/147; G06F 17/148; H03H 17/023; H03H 17/0235; H03H 17/0213
USPC .................................................. 708/400–409
See application file for complete search history.

(56) References Cited

U.S. PATENT DOCUMENTS

| 2005/0069035 | A1* | 3/2005 | Lu ........................ G06F 17/147 375/240.2 |
| 2012/0183032 | A1* | 7/2012 | Yedlapalli ............. G06F 17/141 375/224 |
| 2014/0056535 | A1 | 2/2014 | Suzuki |
| 2015/0301986 | A1 | 10/2015 | Shibayama |

FOREIGN PATENT DOCUMENTS

| JP | 1028057 A | 1/1998 |
| JP | 2001056806 A | 2/2001 |
| JP | 2005101695 A | 4/2005 |
| WO | 2009/120644 A1 | 10/2009 |
| WO | 2013057855 A1 | 4/2013 |
| WO | 2015045310 A1 | 4/2015 |

OTHER PUBLICATIONS

Jongsun Park et al., "Dynamic Bit-Width Adaptation in DCT: An Approach to Trade Off Image Quality and Computation Energy", IEEE Transactions on Very Large Scale Integration (VLSI) Systems, vol. 18, No. 5, May 2010, pp. 787-793, 7 pages total.
Extended European Search Report dated Apr. 30, 2019 issued by the European Patent Office in counterpart application No. 17785901.4.
Cooley, J.W., et al., "An Algorithm for the Machine Calculation of Complex Fourier Series", Mathematics of Computation, American Mathematical Society, 1965, vol. 19, No. 90, pp. 297-301 (6 pages).
Kolba, D.P., et al., "A Prime Factor FFT Algorithm Using High-Speed Convolution", IEEE Transactions on Acoustics, Speech, and Signal Processing, vol. 29, No. 4, Aug. 1977, pp. 281-294.
International Search Report, dated Jul. 18, 2017 from the International Bureau in counterpart International application No. PCT/JP2017/015211.

* cited by examiner

Fig.4

←CYCLE

| 8 | 7 | 6 | 5 | 4 | 3 | 2 | 1 | |
|---|---|---|---|---|---|---|---|---|
| P8 | P7 | P6 | P5 | P4 | P3 | P2 | P1 | |
| 56 | 48 | 40 | 32 | 24 | 16 | 8 | 0 | ps(0) |
| 57 | 49 | 41 | 33 | 25 | 17 | 9 | 1 | ps(1) |
| 58 | 50 | 42 | 34 | 26 | 18 | 10 | 2 | ps(2) |
| 59 | 51 | 43 | 35 | 27 | 19 | 11 | 3 | ps(3) |
| 60 | 52 | 44 | 36 | 28 | 20 | 12 | 4 | ps(4) |
| 61 | 53 | 45 | 37 | 29 | 21 | 13 | 5 | ps(5) |
| 62 | 54 | 46 | 38 | 30 | 22 | 14 | 6 | ps(6) |
| 63 | 55 | 47 | 39 | 31 | 23 | 15 | 7 | ps(7) |

Fig.5

←CYCLE

| 8 | 7 | 6 | 5 | 4 | 3 | 2 | 1 | |
|---|---|---|---|---|---|---|---|---|
| Q8 | Q7 | Q6 | Q5 | Q4 | Q3 | Q2 | Q1 | |
| 7 | 6 | 5 | 4 | 3 | 2 | 1 | 0 | qs(0) |
| 15 | 14 | 13 | 12 | 11 | 10 | 9 | 8 | qs(1) |
| 23 | 22 | 21 | 20 | 19 | 18 | 17 | 16 | qs(2) |
| 31 | 30 | 29 | 28 | 27 | 26 | 25 | 24 | qs(3) |
| 39 | 38 | 37 | 36 | 35 | 34 | 33 | 32 | qs(4) |
| 47 | 46 | 45 | 44 | 43 | 42 | 41 | 40 | qs(5) |
| 55 | 54 | 53 | 52 | 51 | 50 | 49 | 48 | qs(6) |
| 63 | 62 | 61 | 60 | 59 | 58 | 57 | 56 | qs(7) | ent

DIGITAL FILTER DEVICE, DIGITAL FILTERING METHOD, AND PROGRAM RECORDING MEDIUM

This application is a National Stage Entry of PCT/JP2017/015211 filed on Apr. 14, 2017, which claims priority from Japanese Patent Application 2016-083336 filed on Apr. 19, 2016, the contents of all of which are incorporated herein by reference, in their entirety.

TECHNICAL FIELD

The present invention relates to a digital filter device which executes digital signal processing, a digital filtering method, and a program recording medium.

BACKGROUND ART

A fast Fourier transform (hereinafter, FFT: Fast Fourier Transform) process is one of important processes in digital signal processing. For example, FFT is used for frequency domain equalization for compensating a waveform distortion of a signal which is being transmitted. In the frequency domain equalization, signal data on the time domain is transformed to data on the frequency domain by FFT, and then a filtering process for equalization is executed. In addition, the data after the filtering process is retransformed to signal data on the time domain by inverse fast Fourier transform (hereinafter, IFFT: Inverse FFT), and the waveform distortion of the original signal on the time domain is compensated. Hereinafter, when FFT and IFFT are not distinguished, the expression "FFT/IFFT" is used.

In general, in the FFT/IFFT process, "butterfly operation" is used (see, for example, PTL 1 (pp. 3-5, FIG. 25)). In addition, NPL 1 discloses a butterfly operation by Cooley-Tukey, which is an efficient FFT/IFFT processing method. In the meantime, the butterfly operation by Cooley-Tukey has such a problem that when the number of points is large, the circuit of FFT/IFFT becomes complex. On the other hand, NPL 2 discloses a Prime Factor method which decomposes an operation with a large number of points into two small FFT/IFFTs.

In the butterfly operation, since data arranged in a sequential order are read out and processed in an order according to a predetermined rule, rearrangement of data is necessary (see, for example, PTL 2 (p. 5, FIG. 2 and FIG. 3), and PTL 3 (p. 5, FIG. 1). In general, a storage means such as a random access memory (RAM) or a register is used for rearrangement of data (see, for example, PTL 3 (p. 5, FIG. 1) and PTL 4 (pp. 9-10, FIG. 3)).

In general digital signal processing, operations by a floating point, a fixed point and a block floating point are used. In the operation by the floating point, while there is an advantage that an operation can be performed with high precision even when the range of values of signal data, which are handled, is wide, there is a problem that the circuit scale and power consumption are large since complex circuits are required. Besides, in the operation by the fixed point, while there is an advantage that the circuit scale and power consumption are small since circuits are simple, there is a problem that the precision of the operation is low. By contrast, the operation by the block floating point has the advantages of both the floating point and the fixed point. In the operation by the block floating point, a plurality of signal data are collected as one block, and the entirety of the block is normalized so as to have a common exponent on a block-by-block basis.

In any of the operation methods using the floating point, fixed point and block floating method, as the bit width, which represents the signal data, becomes greater, the circuit scale and power consumption increase while the precision in operation becomes higher. Specifically, in any of the operation methods, as regards the bit width representing the signal data, there is a trade-off relationship between the operational precision, and the circuit scale and power consumption.

CITATION LIST

Patent Literature

PTL 1: Japanese Unexamined Patent Application Publication No. H8-137832 A
PTL 2: Japanese Unexamined Patent Application Publication No. 2005-101695 A
PTL 3: Japanese Unexamined Patent Application Publication No. 2001-56806 A
PTL 4: International Publication No. WO2013/057855

Non Patent Literature

NPL 1: J. W. Cooley, J. W. Tukey, "An Algorithm for the Machine Calculation of Complex Fourier Series," Mathematics of Computation, US, American Mathematical Society, April 1965, Vol. 19, No. 90, pp. 297-301
NPL 2: D. P. Kolba, "A Prime Factor FFT Algorithm Using High-Speed Convolution," IEEE Trans. on Acoustics, US, IEEE Signal Processing Society, August 1977, Vol. 29, No. 4, pp. 281-294

SUMMARY OF INVENTION

Technical Problem

In a filtering process, if the bit width of signal data is increased in order to enhance the precision in operation, the circuit scale and power consumption increase. On the other hand, if the bit width of signal data is decreased in order to decrease the circuit scale and power consumption, the precision in operation deteriorates. Thus, in order to reduce the circuit scale and power consumption in the filtering process, it is preferable to optimize partial circuits which constitute the filtering circuit. Specifically, as regards the partial circuits having a small influence on the filter performance even when the precision in operation lowers, it is preferable to optimize the bit width of signal data to a necessary and sufficient value within a range in which the degradation of filter performance due to a decrease in operational precision is tolerable.

In the meantime, in some cases, there is no partial circuit having a small influence on the filter performance even when the precision in operation lowers. In addition, even in the case in which there is a partial circuit having a small influence on the filter performance even when the precision in operation lowers, it is difficult to find such a partial circuit when there are too many partial circuits which constitute the filtering circuit. Specifically, when a partial circuit is not found which has a small influence on the filter performance even when the precision in operation lowers, there arise such problems that the bit width of signal data cannot be optimized to a necessary and sufficient value, and the circuit scale and power consumption in the filtering process cannot be reduced.

According to PTL 4, an increase in circuit scale and an increase in operational clock frequency can be suppressed by performing an adaptive equalization process on signals of the time domain, not in the time domain but in the frequency domain. In the meantime, in PTL 4, by setting a part of adaptive equalizer coefficients, which are used in a multiplier that executes the filtering process, to zero, all bits constituting some tap coefficients, which are unnecessary for achieving a desired process, among a plurality of tap coefficients, are set to 0. Thus, in PTL 4, there is a problem that the filter performance deteriorates due to setting the tap coefficients, other than desired tap coefficients, to zero.

The object of the present invention is to provide a digital filter device which can reduce a circuit scale and power consumption while maintaining filter performance, in order to solve the above-described problems.

Solution to Problem

In one aspect of the present invention, a digital filter device includes a first transform circuit configured to execute a first transform process on data in a predetermined frequency range; a filtering circuit configured to execute a filtering process by setting an operation bit width of data of a preset first frequency component among the data, on which the first transform process was executed by the first transform circuit, to a different bit width from bit widths of other frequency components; and a second transform circuit configured to execute a second transform process on the data on which the filtering process was executed by the filtering circuit.

In one aspect of the present invention, a digital filtering method includes executing a first transform process on data in a predetermined frequency range; executing a filtering process by setting an operation bit width of data of a preset first frequency component among the data, on which the first transform process was executed, to a different bit width from bit widths of other frequency components; and executing a second transform process on the data on which the filtering process was executed.

In one aspect of the present invention, a program recording medium has a digital filtering program recorded thereon, the digital filtering program causing a computer to execute: a process of executing a first transform process on data in a predetermined frequency range; a process of executing a filtering process by setting an operation bit width of data of a preset first frequency component among the data, on which the first transform process was executed, to a different bit width from bit widths of other frequency components; and a process of executing a second transform process on the data on which the filtering process was executed.

Advantageous Effects of Invention

According to the present invention, there can be provided a digital filter device which can reduce a circuit scale and power consumption while maintaining filter performance.

BRIEF DESCRIPTION OF DRAWINGS

FIG. 4 is a view for explaining a sequential order which is one of arrangements of data sets which the digital filter device according to the first example embodiment of the present invention uses in an operation;

FIG. 5 is a view for explaining a bit reverse order which is one of arrangements of data sets which the digital filter device according to the first example embodiment of the present invention uses in an operation;

EXAMPLE EMBODIMENT

Figure 1:
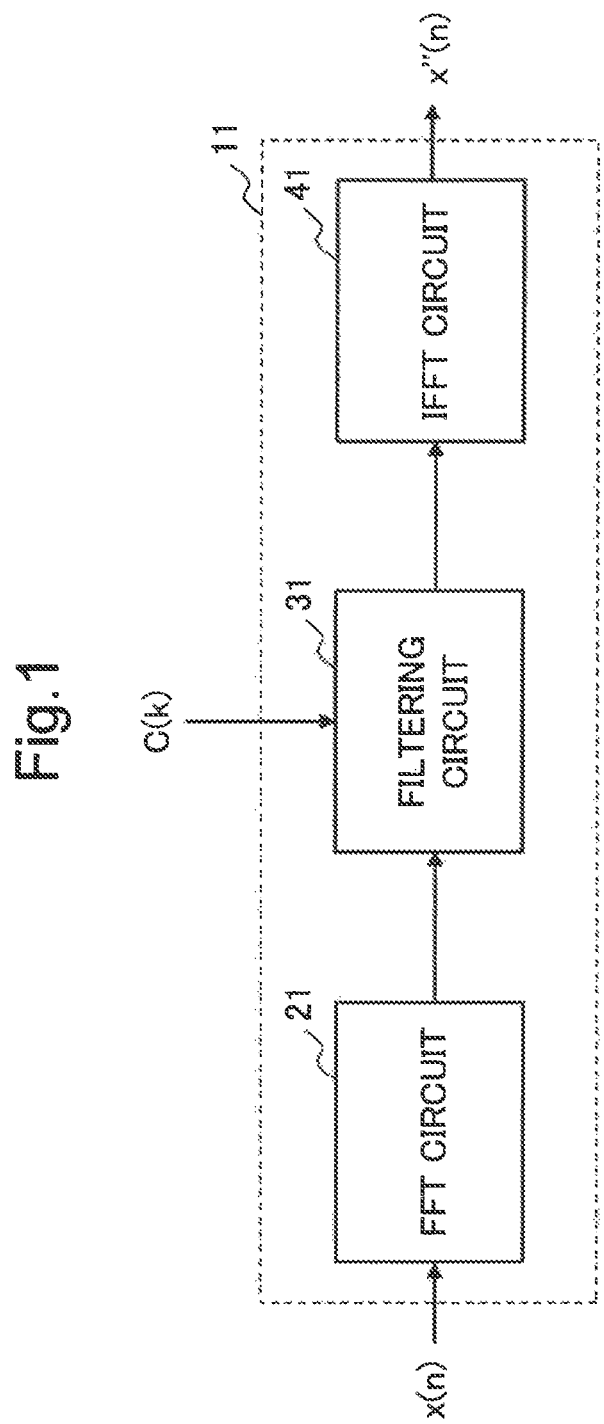
FIG. 1 is a block diagram illustrating a configuration of a digital filter device according to a first example embodiment of the present invention.

Hereinafter, example embodiments for implementing the present invention will be described with reference to the accompanying drawings. In the example embodiments to be described below, although technically preferable limitations are added, the scope of the invention is not limited to the following example embodiments. Note that the same parts are denoted by same reference signs throughout the drawings used in describing the following example embodiments, unless there are particular reasons. In addition, in the example embodiments below, in some cases, a repeated description of similar configurations and operations will be omitted. Besides, the directions of arrows in the drawings illustrate examples, and the directions of signals between blocks are not restricted.

First Example Embodiment

To begin with, a digital filter device according to a first example embodiment of the present invention will be described with reference to the drawings. Hereinafter, fast Fourier transform is referred to as FFT (Fast Fourier Transform), and an inverse fast Fourier transform is referred to as IFFT (Inverse FFT).

FIG. 1 is a block diagram illustrating a configuration of a digital filter device 11 of the present example embodiment.

The digital filter device 11 includes an FFT circuit 21, a filtering circuit 31, and an IFFT circuit 41.

A complex signal x(n) in a time domain is input to the FFT circuit 21. Here, n is an integer of $0 \leq n \leq N-1$, which indicates a signal sample number on the time domain, and N is a natural number which indicates a transform sample number (FFT block size) of FFT. The complex signal x(n) is expressed by the following equation 1 by using a real part r(n), an imaginary part s(n), and an imaginary unit j.

$$x(n) = r(n) + js(n) \quad (1)$$

The FFT circuit 21 transforms the input complex signal x(n) to a complex signal X(k) of a frequency domain by FFT. Here, k is an integer of $0 \leq k \leq N-1$, which indicates a frequency number on the frequency domain. The complex signal X(k) is expressed by the following equation 2 by using a real part A(k), an imaginary part B(k), and an imaginary unit j.

$$X(k) = A(k) + jB(k) \quad (2)$$

The FFT circuit 21 outputs the complex signal X(k) to the filtering circuit 31.

By using a filter coefficient C(k), the filtering circuit 31 executes a complex filtering process by a complex multiplication on the complex signal X(k) which is input from the FFT circuit 21, and calculates a complex signal X'(k). The complex signal X'(k) is calculated by the following equation 3.

$$X'(k) = X(k) \times C(k) \quad (3)$$

The filtering circuit 31 outputs the calculated complex signal X'(k) to the IFFT circuit 41.

The IFFT circuit 41 generates a complex signal x"(n) of the time domain by executing IFFT on the input complex signal X'(k). The IFFT circuit 41 outputs the generated complex signal x"(n).

[Data Flow]

Figure 2:
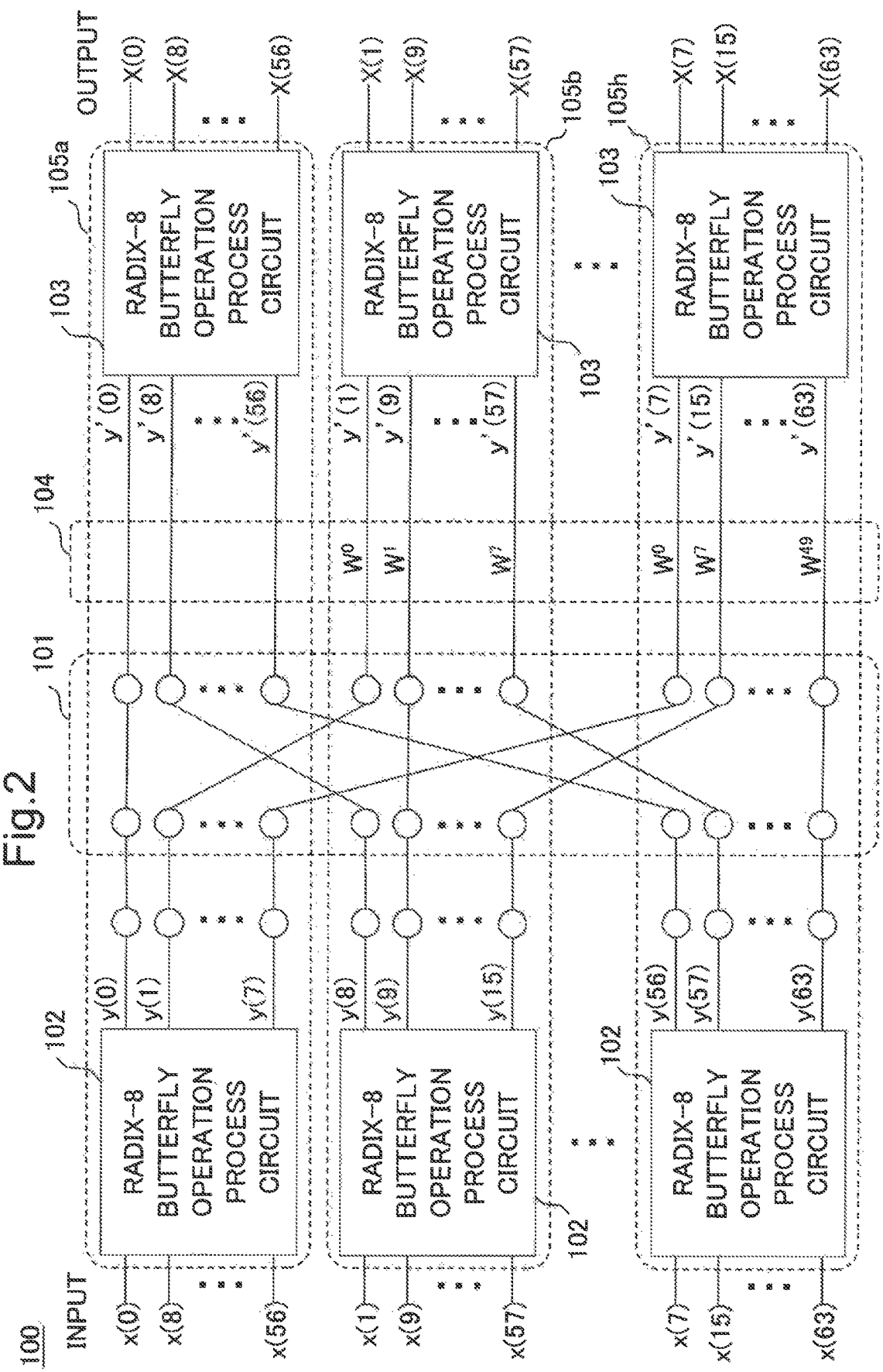
FIG. 2 is a conceptual view illustrating a data flow of a 64-point FFT process for use in a 2-stage butterfly operation which the digital filter device according to the first example embodiment of the present invention executes.

Here, using FIG. 2, a data flow 100 is illustrated in which 64-point FFT, which is decomposed into radix-8 butterfly operation processes of two stages, is executed by a Prime Factor method.

The data flow 100 of FIG. 2 includes a data rearrangement process 101, a butterfly operation process 102, a butterfly operation process 103, and a twiddle multiplication process 104. In the butterfly operation process 102 and butterfly operation process 103, the radix-8 butterfly operation process is executed 16 times in total.

In the data flow 100 of FIG. 2, input data x(n) of the time domain are Fourier-transformed to signals X(k) of the frequency domain by FFT processing (n=0, 1, . . . , 63; k=0, 1, . . . , 63). The basic configuration of the data flow 100 of FIG. 2 is like in the case of executing IFFT processing.

When the number of points of FFT is large, a circuit of an enormous scale is required in order to achieve the entirety of the data flow 100 of FIG. 2. Thus, when the number of points of FFT is large, circuits are not configured to correspond to all processes of the data flow 100, but a part of the processes of the data flow 100 is assigned to any one of circuits. Specifically, in accordance with a necessary processing performance, the circuit, which achieves a part of the processes of the data flow 100, is repeatedly used, and thereby the entirety of the FFT processing may be achieved.

For example, in the data flow 100 of FIG. 2, when the FFT circuit 21, which executes an FFT process on eight data in parallel, is formed as a physical circuit, a 64-point FFT process can be achieved by eight-time repetitive processes in total. Hereinafter, the expression "on eight data in parallel" is described as "in 8-data parallel".

In the eight-time repetitive processes, processes corresponding to partial data flows 105a to 105h, which are executed on eight data, are successively executed. Note that in FIG. 2, a partial data flow 105c, partial data flow 105d, partial data flow 105e, partial data flow 105f, and partial data flow 105g are omitted.

Concretely, the process corresponding to the partial data flow 105a is executed as a first-time process, and the process corresponding to the partial data flow 105b is executed as a second-time process. Similarly, in succession, the process corresponding to the partial data flow 105c is executed as a third-time process, the process corresponding to the partial data flow 105d is executed as a fourth-time process, the process corresponding to the partial data flow 105e is executed as a fifth-time process, the process corresponding to the partial data flow 105f is executed as a sixth-time process, and the process corresponding to the partial data flow 105g is executed as a seventh-time process. Then, the process corresponding to the partial data flow 105h is executed as an eighth-time process. By the series of these processes, the 64-point FFT process can be achieved.

Next, the details of the structural elements of the digital filter device 11 will be described. To begin with, a configuration example of the FFT circuit 21 is described.

[FFT Circuit]

Figure 3:
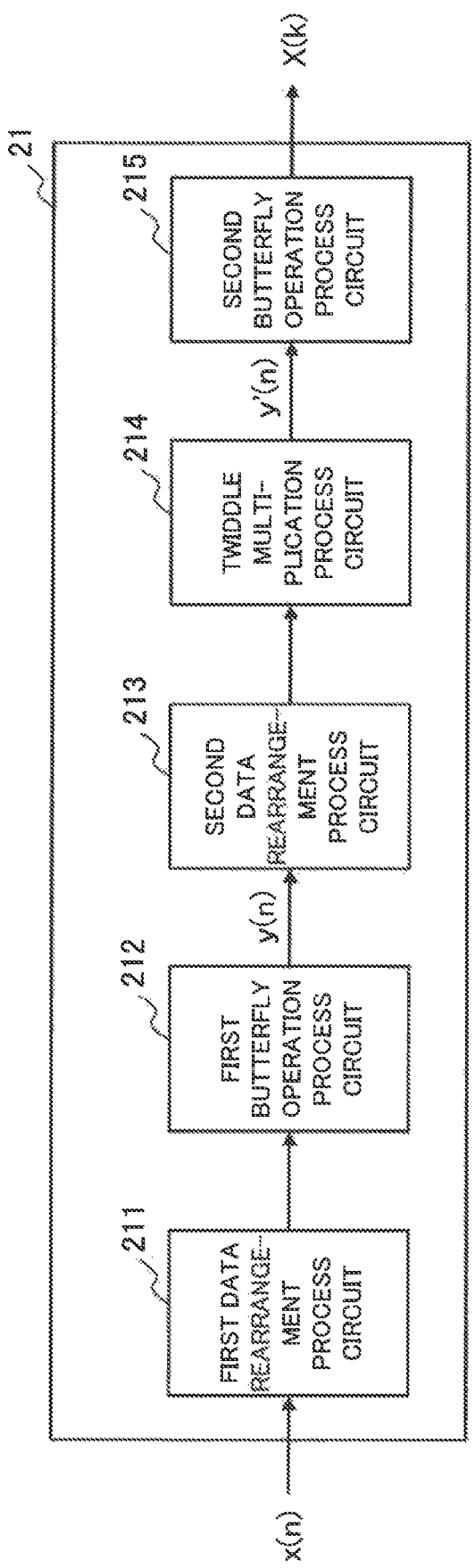
FIG. 3 is a block diagram illustrating a configuration of an FFT circuit of the digital filter device according to the first example embodiment of the present invention.

FIG. 3 is a block diagram illustrating a configuration example of the FFT circuit 21. As illustrated in FIG. 3, the FFT circuit 21 includes a first data rearrangement process circuit 211, a first butterfly operation process circuit 212, a second data rearrangement process circuit 213, a twiddle multiplication process circuit 214 and a second butterfly operation process circuit 215. By using the respective structural elements of FIG. 3, the FFT circuit 21 executes a pipeline process including a first data rearrangement process, a first butterfly operation process, a second data rearrangement process, a twiddle multiplication process and a second butterfly operation process, as in the data flow 100 of FIG. 2.

The first data rearrangement process circuit 211 is a buffer circuit for rearranging data. The first data rearrangement process circuit 211 rearranges a data sequence, based on a relationship of dependency of data on an algorithm in the FFT process. The first data rearrangement process circuit 211 outputs the rearranged data to the first butterfly operation process circuit 212.

Concretely, the first data rearrangement process circuit 211 rearranges input data x(n) from a sequential order (FIG. 4) to a bit reverse order (FIG. 5). Specifically, the first data rearrangement process circuit 211 rearranges the input data x(n) from the sequential order (FIG. 4), which is an input order, to the bit reverse order (FIG. 5) which is an output order to the first butterfly operation process circuit 212.

Each row ps(i) in FIG. 4 and each row qs(i) in FIG. 5 indicate data which are input to an i-th position of the next stage. Each of eight numerals included in each data set is identification information for uniquely identifying one of the points of FFT, and is, concretely, the value of a subscript n of x(n).

The bit reverse order illustrated in FIG. 5 corresponds to input data sets to the first-stage radix-8 butterfly operation process 102 in the data flow 100 illustrated in FIG. 2. Concretely, in a first cycle, eight data of x(0), x(8), . . . , x(56), which constitute a data set Q1, are input. Then, in a second cycle, eight data of x(1), x(9), . . . , x(57), which constitute a data set Q2, are input. Subsequently, from a third cycle to an eighth cycle, eight data constituting each of data sets Q3 to Q8 are similarly input.

The first butterfly operation process circuit 212 is a butterfly circuit which executes the first-time butterfly operation process 102 (first butterfly operation process) of the two-time radix-8 butterfly operation processes executed in the data flow 100 of FIG. 2. The first butterfly operation process circuit 212 executes a butterfly operation process on the data rearranged by the first data rearrangement process circuit 211. The first butterfly operation process circuit 212 outputs the result of the butterfly operation process as data y(n) in the sequential order (n=0, 1, . . . , 63).

The second data rearrangement process circuit 213 is a buffer circuit for rearranging data. The second data rearrangement process circuit 213 rearranges a data sequence, based on the relationship of dependency of data on the algorithm in the FFT process, after the butterfly operation by the first butterfly operation process circuit 212. The second data rearrangement process circuit 213 rearranges the data y(n), which were output in the sequential order by the first butterfly operation process circuit 212, in the bit reverse order for the input to the second butterfly operation process circuit 215. The second data rearrangement process circuit 213 outputs the rearranged data to the twiddle multiplication process circuit 214.

The twiddle multiplication process circuit 214 is a circuit which processes a complex rotation on a complex plane in the FFT operation, after the first butterfly operation process. The twiddle multiplication process circuit 214 executes a twiddle multiplication process corresponding to the twiddle multiplication process 104 in the data flow 100 of FIG. 2. The twiddle multiplication process circuit 214 outputs data y'(n), to which the twiddle multiplication process was applied, to the second butterfly operation process circuit 215. Note that the twiddle multiplication process circuit 214 does not rearrange the data in the twiddle multiplication process.

The second butterfly operation process circuit 215 is a butterfly circuit which executes the second-time radix-8 butterfly operation process 103 (second butterfly operation process) in the data flow 100 of FIG. 2. The second butterfly operation process circuit 215 executes a butterfly operation process on the data y'(n) which are input from the twiddle multiplication process circuit 214 in the bit reverse order (n=0, 1, . . . , 63). The second butterfly operation process circuit 215 outputs data X(k), which is the result of the butterfly operation process, in the bit reverse order (k=0, 1, . . . , 63).

Here, the "sequential order" and "bit reverse order" will concretely be described.

The "sequential order" refers to the order of eight data sets P1, P2, P3, P4, P5, P6, P7, and P8, as illustrated in FIG. 4. If the number of position in the cycle of processing is s, each data set Ps(i) includes eight data ps(0) to ps(7) (i is a natural number; s=1, . . . , 8). Note that Ps(i) is expressed by the following equation 4.

$$ps(i)=8(s-1)+i \qquad (4)$$

In addition, in accordance with the progress of the cycle of processing, the respective data sets are arranged in the order of P1, P2, P3, P4, P5, P6, P7, and P8. Specifically, the sequential order is such an order that an s-number of data sets, in which i×s data are arranged in units of i data for each data set from the first data in the order of data, are prepared, and these data sets are arranged in the order of the cycle.

The "bit reverse order" is an order of eight data sets Q1, Q2, Q3, Q4, Q5, Q6, Q7, and Q8, as illustrated in FIG. 5.

Each data set Qs includes eight data qs(0) to qs(7). Note that qs(i) is expressed by the following equation 5.

$$qs(i)=(s-1)+8i \qquad (5)$$

In addition, in accordance with the progress of the cycle of processing, the respective data sets are arranged in the order of Q1, Q2, Q3, Q4, Q5, Q6, Q7, and Q8. Specifically, the bit reverse order is such an order that the i×s data, which were input in the sequential order, are arranged in units of s data in the order of the cycle from the first data, and the i data of the same cycle are arranged in the order of data as one set.

As described above, each data set of the bit reverse order is uniquely determined if each set of the sequential order is set. The i-th data set Qs(i), which constitutes each data set Qs (s=1, . . . , 8) of the bit reverse order is the s-th data in the cycle i according to the sequential order. Specifically, Qs(i) is expressed by the following equation 6.

$$Qs(i)=Pi(s) \qquad (6)$$

In this manner, Qs(i) and Pi(s) have a relationship in which the order relating to the progress of the cycle and the order relating to the data position are reversed with respect to the data which constitute each data set.

Accordingly, if the data which were input in the bit reverse order are rearranged according to the bit reverse order, the resultant becomes the sequential order.

Note that the sequential order and bit reverse order are not limited to those illustrated in FIG. 4 and FIG. 5. Specifically, each data set of the sequential order may be created by sequentially arranging data in accordance with the number of points of FFT, the number of cycles and the number of parallel-processed data. In addition, as described above, each data set of the bit reverse order may be created by changing the order relating to the progress of the cycle and the order relating to the data position, with respect to the data which are input in the sequential order.

The above is the concrete description of the "sequential order" and "bit reverse order".

For example, the FFT circuit 21 processes, by a pipeline circuit method, the 64-point FFT which is decomposed into two-stage radix-8 butterfly operation processes. Note that it is assumed that the FFT circuit 21 executes the 64-point FFT process in 8-data parallel.

64 input data x(n) in total are input to the FFT circuit 21 in the sequential order illustrated in FIG. 4 during 8 cycles in units of 8 data. Note that numerals of 0 to 63 illustrated in the table of FIG. 4 correspond to n in parentheses of input data x(n).

Concretely, in the first cycle, eight data x(0), x(1), . . . , x(7), which constitute a data set P1, are input to the FFT circuit 21. Then, in the second cycle, eight data x(8), x(9), . . . , x(15), which constitute a data set P2, are input to the FFT circuit 21. Subsequently, likewise, in the third cycle to eighth cycle, data constituting data sets P3 to P8 are successively input to the FFT circuit 21 in units of 8 data.

Similarly, in the order illustrated in FIG. 4, 64 output data X(k) in total are output to the FFT circuit 21 in units of eight data during eight cycles. Note that numerals of 0 to 63 illustrated in the table of FIG. 4 correspond to k in parentheses of output data X(k).

Concretely, in the first cycle, eight data X(0), X(1), . . . , X(7), which constitute the data set P1, are output from the FFT circuit 21. Then, in the second cycle, eight data X(8), X(9), . . . , X(15), which constitute the data set P2, are output from the FFT circuit 21. Subsequently, likewise, in the third cycle to eighth cycle, data constituting the data sets P3 to P8 are successively output from the FFT circuit 21 in units of 8 data.

The first data rearrangement process circuit 211 and second data rearrangement process circuit 213 temporarily store input data, controls selection and output of the stored data, and achieves data rearrangement processes according to the sequential (FIG. 4) and bit reverse order (FIG. 5).

Figure 6:
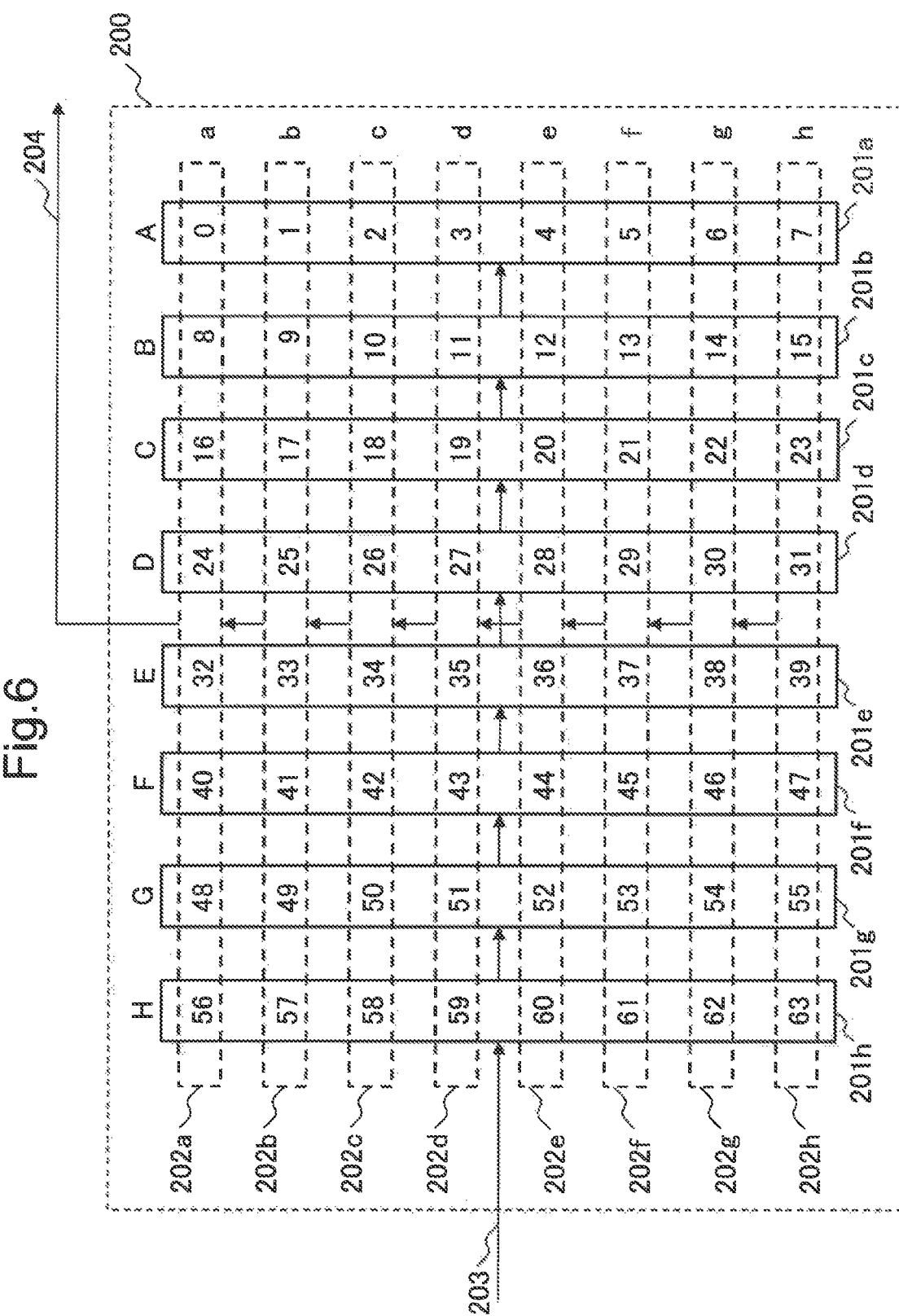
FIG. 6 is a block diagram illustrating a configuration example of a data rearrangement circuit of the digital filter device according to the first example embodiment of the present invention.

The first data rearrangement process circuit 211 and second data rearrangement process circuit 213 can be achieved, for example, by a data rearrangement process circuit 200 illustrated in FIG. 6.

The data rearrangement process circuit 200 inputs therein data sets D1 to D8 (input information 203), each of which is composed of eight data, in a first-in order in a first-in first-out buffer (hereinafter, FIFO buffer: First In First Out Buffer). Then, the data rearrangement process circuit 200 writes data to data storage positions 201a to 201h and stores the data. Specifically, the data rearrangement process circuit 200 stores the data sets D1 to D8 at the data storage positions 201a to 201h, respectively.

Next, the data rearrangement process circuit 200 outputs the storage data in a first-out order in the FIFO buffer. Concretely, the data rearrangement process circuit 200 forms one data set of eight data which are read out from each of data read positions 202a to 202h, and outputs eight data sets D1' to D8' (output information 204). Specifically, the data sets D1' to D8' are formed such that the data included in the data sets D1 to D8, which are arranged in the cycle order, are rearranged in the order of data positions and formed as one set.

As described above, in the FFT circuit 21, the rearrangement processes according to the sequential order (FIG. 4) and bit reverse order (FIG. 5) by the first data rearrangement process circuit 211 and second data rearrangement process circuit 213 are necessary. The reason for this is that since the FFT circuit 21 executes the 64-point FFT process in 8-data parallel, eight cycles are necessary for the FFT process, and data rearrangement over the cycles is required.

[Filtering Circuit]

Figure 7:
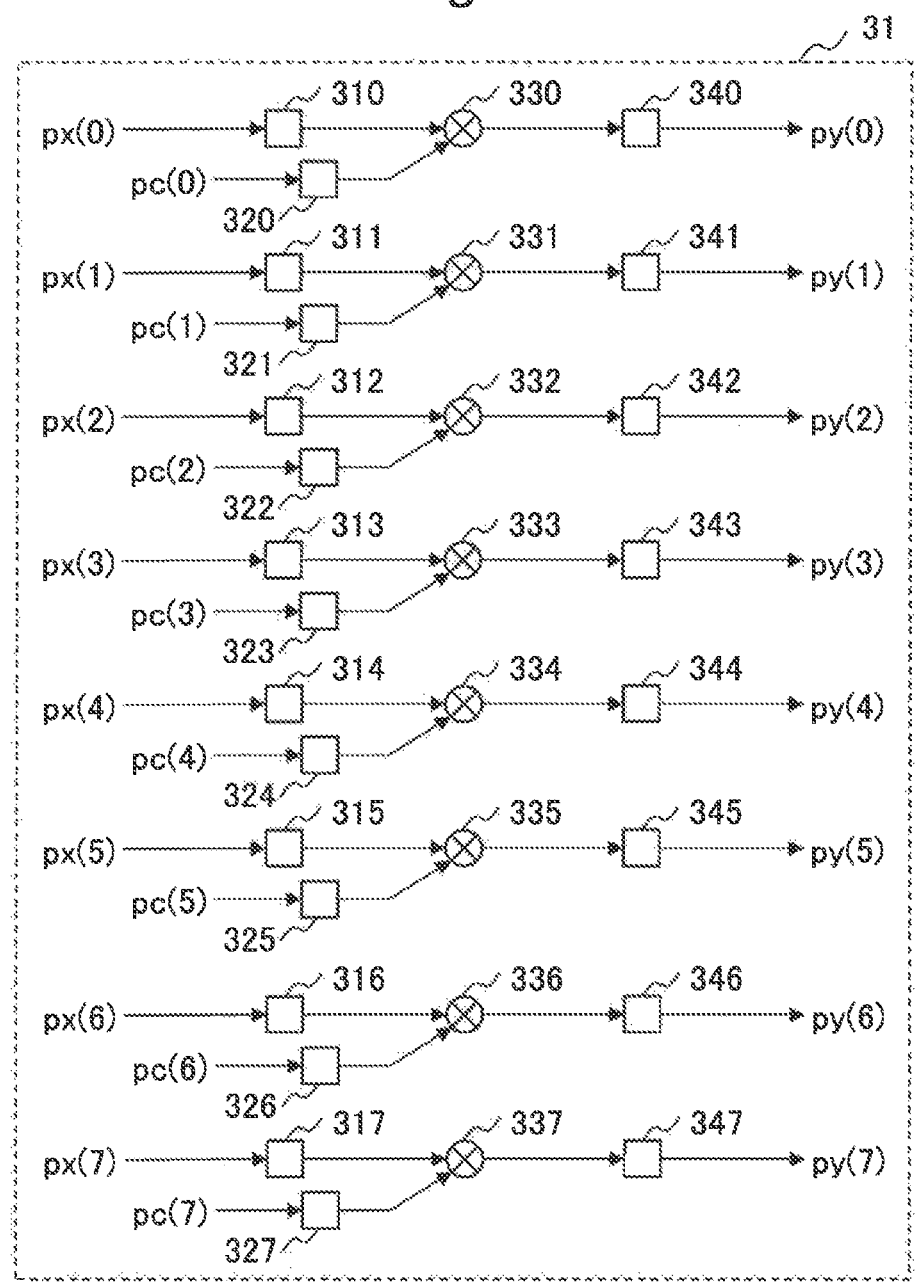
FIG. 7 is a block diagram illustrating a configuration example of a filtering circuit of the digital filter device according to the first example embodiment of the present invention.

FIG. 7 is a block diagram illustrating a configuration example of the filtering circuit 31 of the present example embodiment. The filtering circuit 31 includes bit width reduction circuits 310 to 317, bit width reduction circuits 320 to 327, complex multipliers 330 to 337, and bit width extension circuits 340 to 347.

Hereinafter, it is assumed that, like the FFT circuit 21, the filtering circuit 31 executes a filter operation process in 8-data parallel. In this case, the data X(k) of the frequency domain, which the FFT circuit 21 outputs in the bit reverse order, are input to the filtering circuit 31.

Concretely, as the input data X(k), 64 data are input during eight cycles in units of 8 data in the bit reverse order illustrated in FIG. 5. Note that k in parentheses of X(k) means numerals from 0 to 63 in FIG. 5. Specifically, in the first cycle, eight data X(0), X(1), . . . , X(7), which constitute the data set Q1, are input to the filtering circuit 31. In the second cycle, eight data X(8), X(9), . . . , X(15), which constitute the data set Q2, are input to the filtering circuit 31. Subsequently, likewise, in the third cycle to eighth cycle, the data constituting the data sets Q3 to Q8 are successively input to the filtering circuit 31. Similarly, filter coefficients C(k) of 64 data are input to the filtering circuit 31 in the bit reverse order during eight cycles in units of eight data.

Next, the bit width reduction circuits 310 to 317 of the filtering circuit 31 reduce bit widths of the data X(k) which are input in units of eight data. The bit width reduction circuits 310 to 317 output data with the reduced bit widths to the complex multipliers 330 to 337.

Concretely, the bit width reduction circuit 310 generates data X'(k) in which the bit width of X(k) that is input from an input px(0) is reduced. Similarly, the bit width reduction circuit 311 generates data X'(k) in which the bit width of X(k) that is input from an input px(1) is reduced. Subsequently, likewise, the bit width reduction circuits 312 to 317 generate data X'(k) in which the bit widths of X(k) that are input from inputs px(2) to px(7) are reduced. The reduction of the bit width can be achieved by a cut-off process or a rounding process. Note that the amounts of the reduction of the bit width, which the bit width reduction circuits 310 to 317 execute, may be identical among the respective circuits, or may be different among the respective circuits.

Similarly, the bit width reduction circuits 320 to 327 of the filtering circuit 31 reduce bit widths of the filter coefficients C(k) which are input in units of eight data. The bit width reduction circuits 320 to 327 output data with the reduced bit widths to the complex multipliers 330 to 337.

Concretely, the bit width reduction circuit 320 generates data C'(k) in which the bit width of C(k) that is input from an input pc(0) is reduced. Similarly, the bit width reduction circuit 321 generates data C'(k) in which the bit width of C(k) that is input from an input pc(1) is reduced. Subsequently, likewise, the bit width reduction circuits 321 to 327 generate data C'(k) in which the bit widths of C(k) that are input from inputs pc(2) to pc(7) are reduced. The reduction of the bit width can be achieved by a cut-off process or a rounding process. Note that the amounts of the reduction of the bit width, which the bit width reduction circuits 320 to 327 execute, may be identical among the respective circuits, or may be different among the respective circuits.

Next, the complex multipliers 330 to 337 of the filtering circuit 31 perform complex filtering processes which execute complex multiplications in 8-data parallel, by using the data X'(k) and filter coefficients C'(k) with the reduced bit widths.

Concretely, in the first cycle, the complex multiplier 330 executes a complex multiplication by using X'(0) with the reduced bit width, which is input from the input px(0), and C'(0) with the reduced bit width, which is input from the input pc(0). At this time, the complex multiplier 330 calculates Y(0)=X'(0)×C'(0), and outputs the calculated Y(0).

Similarly, the complex multiplier 331 executes a complex multiplication by using X'(8) with the reduced bit width, which is input from the input px(1), and C'(8) with the reduced bit width, which is input from the input pc(1). At this time, the complex multiplier 331 calculates Y(8)=X'(8)×C'(8), and outputs the calculated Y(8).

Likewise, the complex multiplier 332 executes a complex multiplication by using X'(16) with the reduced bit width, which is input from the input px(2), and C'(16) with the reduced bit width, which is input from the input pc(2). At this time, the complex multiplier 332 calculates Y(16)=X'(16)×C'(16), and outputs the calculated Y(16).

Subsequently, in the similar manner, the complex multiplier, 333 to 337, executes a complex multiplication by using X'(j) with the reduced bit width, which is input from the input px(k), and C'(j) with the reduced bit width, which is input from the input pc(k) (where 3≤k≤7, j=k×8). At this time, the complex multiplier, 332 to 337, calculates Y(j)=X'(j)×C'(j), and outputs the calculated Y(j). Note that k and j in parentheses in px(k), pc(k), X'(j), C'(j), and Y(j) are also referred to as frequency numbers.

Next, in the second cycle, the complex multiplier 331 of the filtering circuit 31 executes a complex multiplication by using X'(1) with the reduced bit width, which is input from the input px(0), and C'(1) with the reduced bit width, which is input from the input pc(0). At this time, the complex multiplier 331 calculates Y(1)=X'(1)×C'(1), and outputs the calculated Y(1).

Similarly, the complex multiplier 332 executes a complex multiplication by using X'(9) with the reduced bit width, which is input from the input px(1), and C'(9) with the reduced bit width, which is input from the input pc(1). At this time, the complex multiplier 332 calculates Y(9)=X'(9)×C'(9), and outputs the calculated Y(9).

Likewise, the complex multiplier 332 executes a complex multiplication by using X'(17) with the reduced bit width, which is input from the input px(2), and C'(17) with the reduced bit width, which is input from the input pc(2). At this time, the complex multiplier 332 calculates Y(17)=X'(17)×C'(17), and outputs the calculated Y(17).

Subsequently, in the similar manner, the complex multiplier, 333 to 337, executes a complex multiplication by using X'(j+1) with the reduced bit width, which is input from the input px(k), and C'(j+1) with the reduced bit width, which is input from the input pc(k) (where 3≤k≤7, j=k×8). At this time, the complex multiplier, 332 to 337, calculates Y(j+1)=X'(j+1)×C'(j+1), and outputs the calculated Y(j+1).

Furthermore, in an n-th (3≤n≤7) cycle of the third and following cycles, the complex multipliers 330 to 337 similarly execute complex multiplications. Specifically, the complex multiplier, 330 to 337, executes a complex multiplication by using X'(j+n) with the reduced bit width, which is input from the input px(k), and C'(j+n) with the reduced bit width, which is input from the input pc(k) (where 0≤k≤7, j=k×8). At this time, the complex multiplier, 330 to 337, calculates Y(j+n)=X'(j+n)×C'(j+n), and outputs the calculated Y(j+n).

Specifically, the complex multiplier 330 inputs therein eight data of X'(0), X'(1), . . . , X'(7) and eight data of C'(0), C'(1), . . . , C'(7), and calculates and outputs eight data of Y(0), Y(1), . . . , Y(7).

Similarly, the complex multiplier 331 inputs therein eight data of X'(8), X'(9), . . . , X'(15) and eight data of C'(8), C'(9), . . . , C'(15), and calculates and outputs eight data of Y(8), Y(9), . . . , Y(15).

Likewise, the complex multiplier 332 inputs therein eight data of X'(16), X'(17), . . . , X'(23) and eight data of C'(16), C'(17), . . . , C'(23), and calculates and outputs eight data of Y(16), Y(17), . . . , Y(23).

Similarly, the complex multiplier 333 inputs therein eight data of X'(24) to X'(31) and eight data of C'(24) to C'(31), and calculates and outputs eight data of Y(24) to Y(31).

Similarly, the complex multiplier 334 inputs therein eight data of X'(32) to X'(39) and eight data of C'(32) to C'(39), and calculates and outputs eight data of Y(32) to Y(39).

Similarly, the complex multiplier 335 inputs therein eight data of X'(40) to X'(47) and eight data of C'(40) to C'(47), and calculates and outputs eight data of Y(40) to Y(47).

Similarly, the complex multiplier 336 inputs therein eight data of X'(48) to X'(55) and eight data of C'(48) to C'(55), and calculates and outputs eight data of Y(48) to Y(55).

Similarly, the complex multiplier 337 inputs therein eight data of X'(56) to X'(63) and eight data of C'(56) to C'(63), and calculates and outputs eight data of Y(56) to Y(63).

As described above, each of the complex multipliers 330 to 337 inputs therein data with neighboring frequency numbers, and calculates and outputs data with neighboring frequency numbers. Here, the amounts of the reduction of the bit width, which the bit width reduction circuits 310 to 317 and bit width reduction circuits 320 to 327 execute, may be different. Specifically, the operation bit widths in the complex multipliers 330 to 337 may be different. Accordingly, the bit widths of outputs of the complex multipliers 330 to 337 may be different.

Next, the bit width extension circuits 340 to 347 extend the bit widths of Y(k) which the complex multipliers 330 to 337 calculate and output, and output the data with the extended bit widths to outputs py(0) to py(7). The extension of the bit width is enabled, for example, by adding a necessary number of values 0 to the least significant bit of data.

Specifically, the bit width extension circuit 340 extends the bit width such that the bit width becomes identical among the outputs py(0) to py(7), in accordance with the bit width of Y(k) which is input from the complex multiplier 330, and outputs the data with the extended bit width to the output py(0). Similarly, the bit width extension circuit 341 extends the bit width such that the bit width becomes identical among the outputs py(0) to py(7), in accordance with the bit width of Y(k) which is input from the complex multiplier 331, and outputs the data with the extended bit width to the output py(1). Subsequently, in the similar manner, each of the bit width extension circuits 342 to 347 extends the bit width such that the bit width becomes identical among the outputs py(0) to py(7), in accordance with the bit width of Y(k) which is input from the complex multiplier 332 to 337. Then, the bit width extension circuits 342 to 347 output the data with the extended bit widths to the outputs py(2) to py(7), respectively.

As regards the filtering process which the digital filter device 11 executes, there is a case in which the filtering in a certain frequency range is not important, compared to the filtering of the other frequency range. In such a case, an influence on filter performance is small even if the operation bit width of the complex multiplier, which executes the filtering of the frequency range that is not important, is made less than the operation bit width of the complex multiplier, which executes the filtering of the other frequency range. Specifically, there is a case in which, even if the operation bit width of the complex multiplier, which executes the filtering of the frequency range that is not important, is made small, the filter performance does not lower, or a desired filter characteristic is obtained even if the filter performance lowers. In such a case, the operation bit width of the complex multiplier, which executes the filtering of the frequency range that is not important, can be made less than the operation bit width of the complex multiplier, which executes the filtering of the other frequency range.

In other words, the filtering circuit 31 of the present example embodiment sets the operation bit widths of a plurality of complex multipliers which execute filtering, in accordance with the degree of importance of the frequency range which is a target of the filtering. Specifically, the filtering circuit 31 reduces the operation bit width in the complex multiplier which executes the filtering of data of a frequency range with a low degree of importance. Note that the frequency range with a low degree of importance means a range including a frequency component, with which a desired filter characteristic can be obtained even if the bit width of the data of the frequency range with the low degree of importance is reduced.

For example, there is a case in which filtering of a region with a high frequency is less important than filtering of the other frequency region. In such a case, the operation bit width of the complex multiplier, which executes the filtering of the region with the high frequency, can be made less than the operation bit widths of the other complex multipliers.

In addition, for example, there is a case in which filtering of a region with a low frequency is less important than filtering of the other frequency region. In such a case, the operation bit width of the complex multiplier, which executes the filtering of the region with the low frequency, can be made less than the operation bit widths of the other complex multipliers.

Furthermore, for example, there is a case in which filtering of a specific frequency region is less important than filtering of the other frequency region. In such a case, the operation bit width of the complex multiplier, which executes the filtering of the specific frequency region, can be made less than the operation bit widths of the other complex multipliers.

Specifically, the filtering circuit 31 executes a filtering process by setting an operation bit width of data of a preset first frequency component among the data, on which the transform process was executed by the FFT circuit 21, to a different bit width from bit widths of other frequency components. Note that the preset first frequency component is a component with which a desired filter characteristic can be obtained even if the bit width of the data of this frequency component is varied.

[IFFT Circuit]

Figure 8:
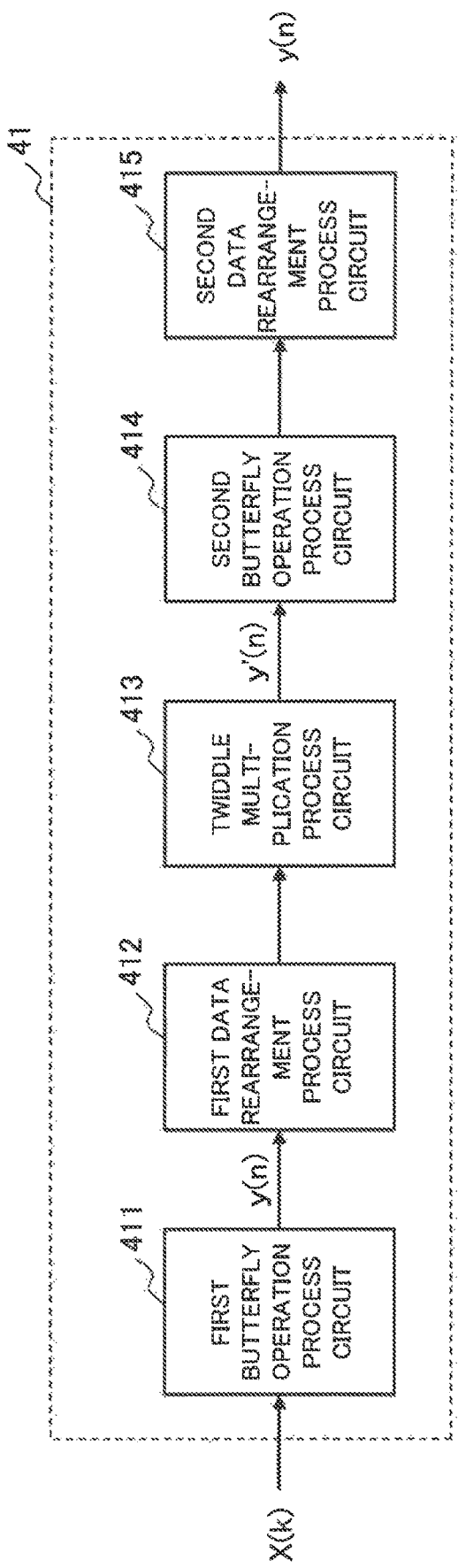
FIG. 8 is a block diagram illustrating a configuration of an IFFT circuit of the digital filter device according to the first example embodiment of the present invention.

FIG. 8 is a block diagram illustrating a configuration of the IFFT circuit 41 of the present example embodiment. The IFFT circuit 41 processes, by a pipeline circuit method, 64-point IFFT which is decomposed into two-stage radix-8 butterfly operation processes, in a data flow similar to the data flow 100 of FFT illustrated in FIG. 2.

The IFFT circuit 41 inputs therein the signal X(k) of the frequency domain, which was Fourier-transformed by the FFT circuit 21 and filtered by the filtering circuit 31 (k=0, 1, ..., N−1). Note that N is a positive integer representing an IFFT block size. The IFFT circuit 41 generates data y(n) of the time domain by inversely Fourier-transforming the input X(k), and outputs the generated data y(n) (n=0, 1, ..., N−1).

The IFFT circuit 41 executes a 64-point IFFT process in 8-data parallel. The IFFT circuit 41 inputs therein the data X(k) in the bit reverse order illustrated in FIG. 5, like the outputs of the FFT circuit 21 and filtering circuit 31. In addition, the IFFT circuit 41 outputs the data y(n) in the sequential order illustrated in FIG. 4.

The IFFT circuit 41 includes a first butterfly operation process circuit 411, a first data rearrangement process circuit 412, a twiddle multiplication process circuit 413, a second butterfly operation process circuit 414, and a second data rearrangement process circuit 415. By using the respective structural elements of FIG. 8, the IFFT circuit 41 executes a pipeline process including a first butterfly operation process, a first data rearrangement process, a twiddle multiplication process, a second butterfly operation process, and a second data rearrangement process.

The first butterfly operation process circuit 411 is a butterfly circuit which executes the first-time butterfly operation process 102 (first butterfly operation process) of the two-time radix-8 butterfly operation processes executed in the data flow 100 of FIG. 2. The first butterfly operation process circuit 411 outputs a result of the butterfly operation process of the input data X(k) as data y(n) in the sequential order (FIG. 4) (n=0, 1, ..., 63).

The first data rearrangement process circuit 412 is a buffer circuit for rearranging data. For example, the first data rearrangement process circuit 412 can be achieved by the data rearrangement process circuit 200 illustrated in FIG. 6.

The first data rearrangement process circuit 412 rearranges a data sequence, based on a relationship of dependency of data on an algorithm in the IFFT process. Specifically, the first data rearrangement process circuit 412 rearranges the data y(n), which the first butterfly operation process circuit 411 outputs in the sequential order, in the bit reverse order (FIG. 5) in order to input the data y(n) to the twiddle multiplication process circuit 413.

The twiddle multiplication process circuit 413 is a circuit which processes a complex rotation on a complex plane in the IFFT operation, after the first butterfly operation process. The twiddle multiplication process circuit 413 executes a twiddle multiplication process corresponding to the twiddle multiplication process 104 in the data flow 100 of FIG. 2. The twiddle multiplication process circuit 413 outputs data y'(n), to which the twiddle multiplication process was applied, to the second butterfly operation process circuit 414. Note that the twiddle multiplication process circuit 413 does not rearrange the data in the twiddle multiplication process.

The second butterfly operation process circuit 414 is a butterfly circuit which executes the second-time radix-8 butterfly operation process 103 (second butterfly operation process) in the data flow 100 of FIG. 2. The second butterfly operation process circuit 414 executes a butterfly operation process on the data y'(n) which are input from the twiddle multiplication process circuit 413 in the bit reverse order (n=0, 1, ..., 63). The second butterfly operation process circuit 414 outputs data X(k), which is the result of the butterfly operation process, in the bit reverse order (k=0, 1, ..., 63).

The second data rearrangement process circuit 415 is a buffer circuit for rearranging data. For example, the second data rearrangement process circuit 415 can be achieved by the data rearrangement process circuit 200 illustrated in FIG. 6.

The second data rearrangement process circuit 415 rearranges a data sequence, based on the relationship of dependency of data on the algorithm in the IFFT process. Specifically, the second data rearrangement process circuit 415 rearranges the data X(k), which the second butterfly operation process circuit 414 outputs in the bit reverse order, in the sequential order (FIG. 4). Then, the IFFT circuit 41 outputs the final result of the IFFT process in the sequential order.

Advantageous Effects

As described above, in the present example embodiment, the operation bit width of the complex multiplier, which executes the filtering of the frequency range that is not important, is made less than the operation bit width of the complex multiplier, which executes the filtering of the other frequency range. As a result, in the present example embodiment, a sufficient filter performance is obtained with respect to the processing of the desired frequency range, and the complex multiplier, which performs the filtering of the frequency range that is not important, can be simplified. In short, according to the present example embodiment, the circuit scale and power consumption can be reduced without degrading the filter performance.

Second Example Embodiment

Next, a digital filter device according to a second example embodiment of the present invention will be described with reference to the drawings. The digital filter device according to the present example embodiment differs from the first example embodiment with respect to the configuration of the filtering circuit. Note that since the configurations of the FFT circuit and IFFT circuit of the digital filter device according to the present example embodiment are similar to those in the first example embodiment, a detailed description thereof is omitted.

Figure 9:
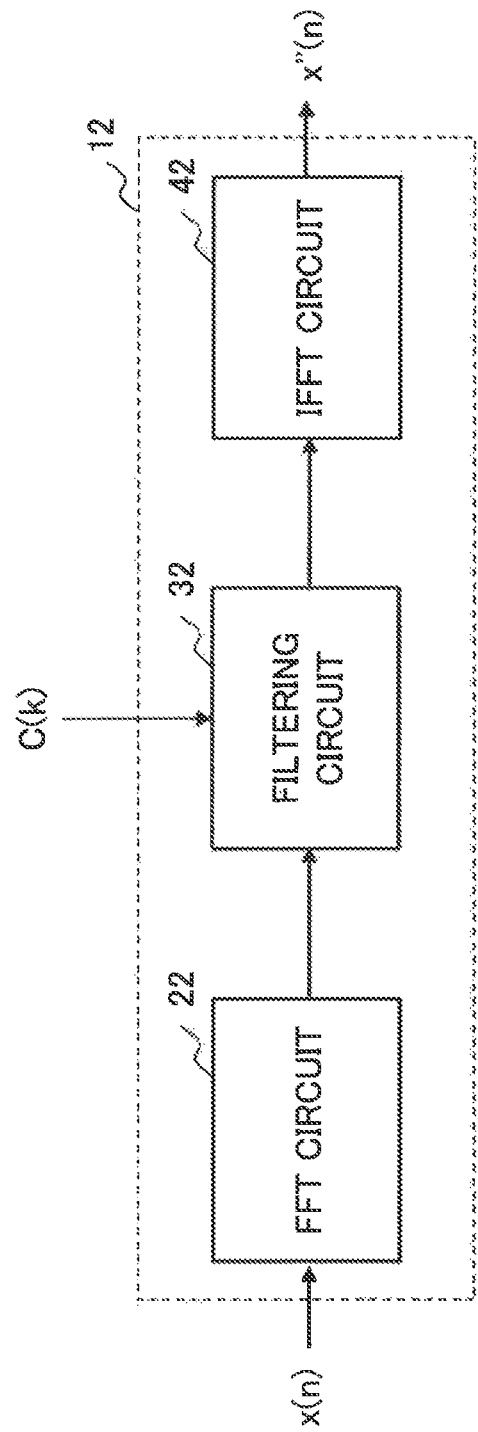
FIG. 9 is a block diagram illustrating a configuration of a digital filter device according to a second example embodiment of the present invention.

FIG. 9 is a block diagram illustrating a configuration of a digital filter device 12 of the present example embodiment. The digital filter device 12 includes an FFT circuit 22, a filtering circuit 32, and an IFFT circuit 42. Note that since the FFT circuit 22 and IFFT circuit 42 of the present example embodiment have similar configurations to those of the FFT circuit 21 and IFFT circuit 41 of the first example embodiment, a detailed description thereof is omitted.

Figure 10:
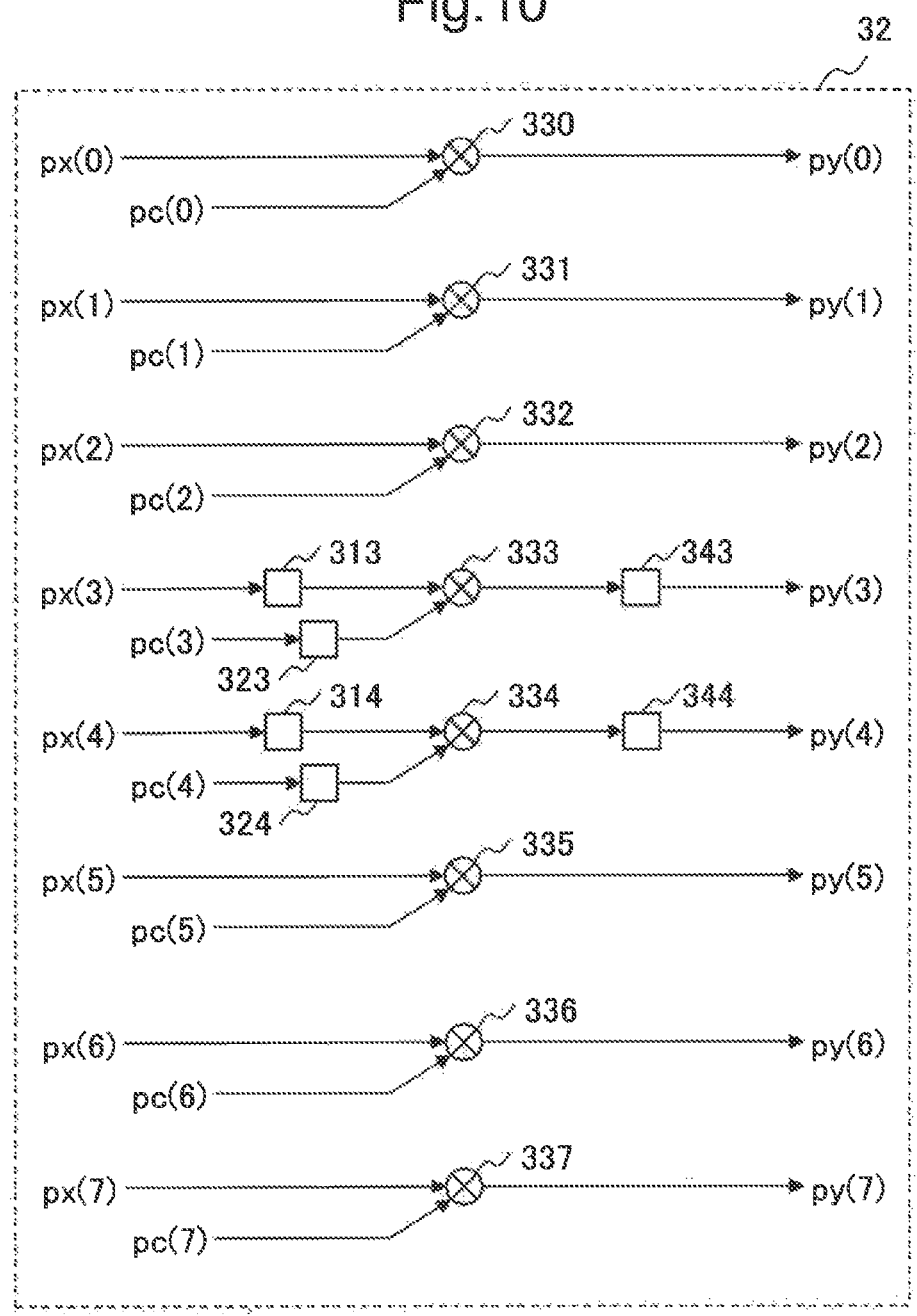
FIG. 10 is a block diagram illustrating a configuration example of a filtering circuit of the digital filter device according to the second example embodiment of the present invention.

FIG. 10 is a block diagram illustrating a configuration example of the filtering circuit 32 of the present example embodiment. As illustrated in FIG. 10, the filtering circuit 32 includes bit width reduction circuits 313 and 314, bit width reduction circuits 323 and 324, complex multipliers 333 and 334, and bit width extension circuits 343 and 344. In other words, the filtering circuit 32 is configured by omitting, from the filtering circuit 31 of FIG. 7, the configuration other than the bit width reduction circuits 313 and 314, bit width reduction circuits 323 and 324, complex multipliers 333 and 334, and bit width extension circuits 343 and 344.

The filtering circuit 32 has a configuration in which only the operation bit widths of the complex multipliers 333 and 334 which execute the filtering of a high frequency range are reduced. The filtering circuit 32 does not reduce the operation bit widths of the complex multipliers 330 to 332 and 335 to 337 which execute the filtering of other frequency ranges. Note that in the present example embodiment, it is assumed that the degree of importance of the high frequency range is low.

In the filtering circuit 32 of the present example embodiment, too, the data X(k) of the frequency domain, which the FFT circuit 21 outputs in the reverse order, are input. Concretely, the filtering circuit 32 inputs therein input data X(k) of 64 data in the bit reverse order (FIG. 6) during eight cycles in units of eight data. Accordingly, each of the complex multipliers 330 to 337 inputs therein data with neighboring frequency numbers, and calculates and outputs data with neighboring frequency numbers. The data of the high frequency range are input to the complex multiplier 333 and complex multiplier 334, and the complex multiplier 333 and complex multiplier 334 execute filtering operations on the data of the high frequency range.

For example, when the digital filter device of the present example embodiment is applied to distortion compensation in optical fiber communication, there is a case in which the filtering of a high frequency range is less important than the filtering of other frequency ranges. At this time, the filtering circuit of the present example embodiment can make the operation bit width of the complex multiplier, which executes the filtering of the high frequency range, smaller than the operation bit width of the complex multiplier, which executes the filtering of the other frequency range. As a result, according to the present example embodiment, the circuit scale and power consumption can be reduced without degrading the filter performance.

Third Embodiment

Next, a digital filter device according to a third example embodiment of the present invention will be described with reference to the drawings. The present example embodiment has a configuration of a generic concept of the first and second example embodiments.

Figure 11:
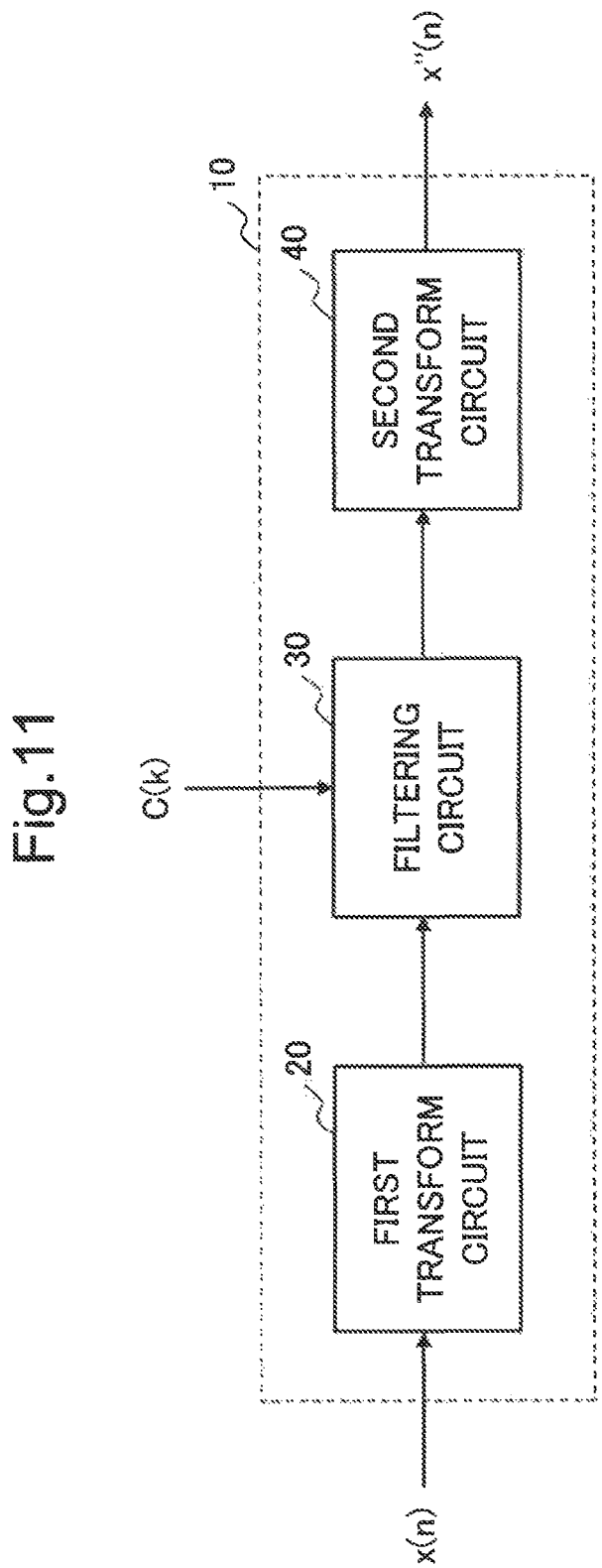
FIG. 11 is a block diagram illustrating a configuration of a digital filter device according to a third example embodiment of the present invention.

FIG. 11 is a block diagram illustrating a configuration of a digital filter device 10 according to the present example embodiment. The digital filter device 10 includes a first transform circuit 20, a filtering circuit 30, and a second transform circuit 40.

The first transform circuit 20 inputs therein a plurality of data, and executes a first transform process on the input plural data x(n). The first transform circuit 20 executes an FFT transform process or an IFFT transform process as the first transform process.

The filtering circuit 30 executes a filtering process by setting an operation bit width of data of a preset first frequency component among the data, on which the first transform process was executed by the first transform circuit 20, to a different bit width from bit widths of other frequency components. The preset first frequency component is a frequency component, with which a desired filter characteristic can be obtained even if the bit width of the data of this frequency component is varied. For example, the filtering circuit 30 includes an operation circuit in which the data of the frequency component, with which a desired filter characteristic can be obtained even if the operation bit width is varied, is set as the data of the first frequency component.

For example, the filtering circuit 30 executes a filtering process by reducing the operation bit width of the data of the first frequency component. For example, the filtering circuit 30 includes an operation circuit in which the operation bit width of the data of the first frequency component is set to a bit width which is less than bit widths of data of the other frequency range. For example, the filtering circuit 30 reduces the operation bit width of data with a low degree of importance among a plurality of data.

The filtering circuit 30 executes an operation process between the plural data including the data with the reduced bit width, and a filter coefficient which is separately input. The filtering circuit 30 extends the bit width of the data with the small bit width, which are included in the data on which the operation process was executed, to the same bit number as the other data, and outputs the data with the extended bit width.

The second transform circuit 40 executes a second transform process on plural data X(n) which are output from the filtering circuit 30. The second transform circuit 40 executes an FFT transform process or IFFT transform process as the second transform process. For example, the second transform circuit 40 executes an inverse Fourier transform process when the first transform circuit 20 executed a fast Fourier transform process, and executes a Fourier transform process when the first transform circuit 20 executed an inverse fast Fourier transform process.

In addition, data which the filtering circuit 30 processes, and the arrangement of the data can also be expressed as follows.

The first transform circuit 20 inputs therein first data in one of first and second orders, and outputs, in the second order, second data which are generated by executing the first transform process on the input first data.

The filtering circuit 30 inputs therein the second data in the second order, and outputs, in the second order, third data which are generated by executing the filtering process on the input second data.

The second transform circuit 40 inputs therein the third data in the second order, and outputs, in one of the first and second orders, fourth data which are generated by executing the second transform process on the input third data.

In the above, the first order is the sequential order, and the second order is the bit reverse order. In addition, the first data are the input data to the first transform circuit 20, the second data are the output data from the first transform circuit 20, the third data are the output data from the filtering circuit 30, and the fourth data are the output data from the second transform circuit 40. Specifically, the first data are the input data to the digital filter device 10, and the fourth data are the output data from the digital filter device 10.

[Filtering Circuit]

Figure 12:
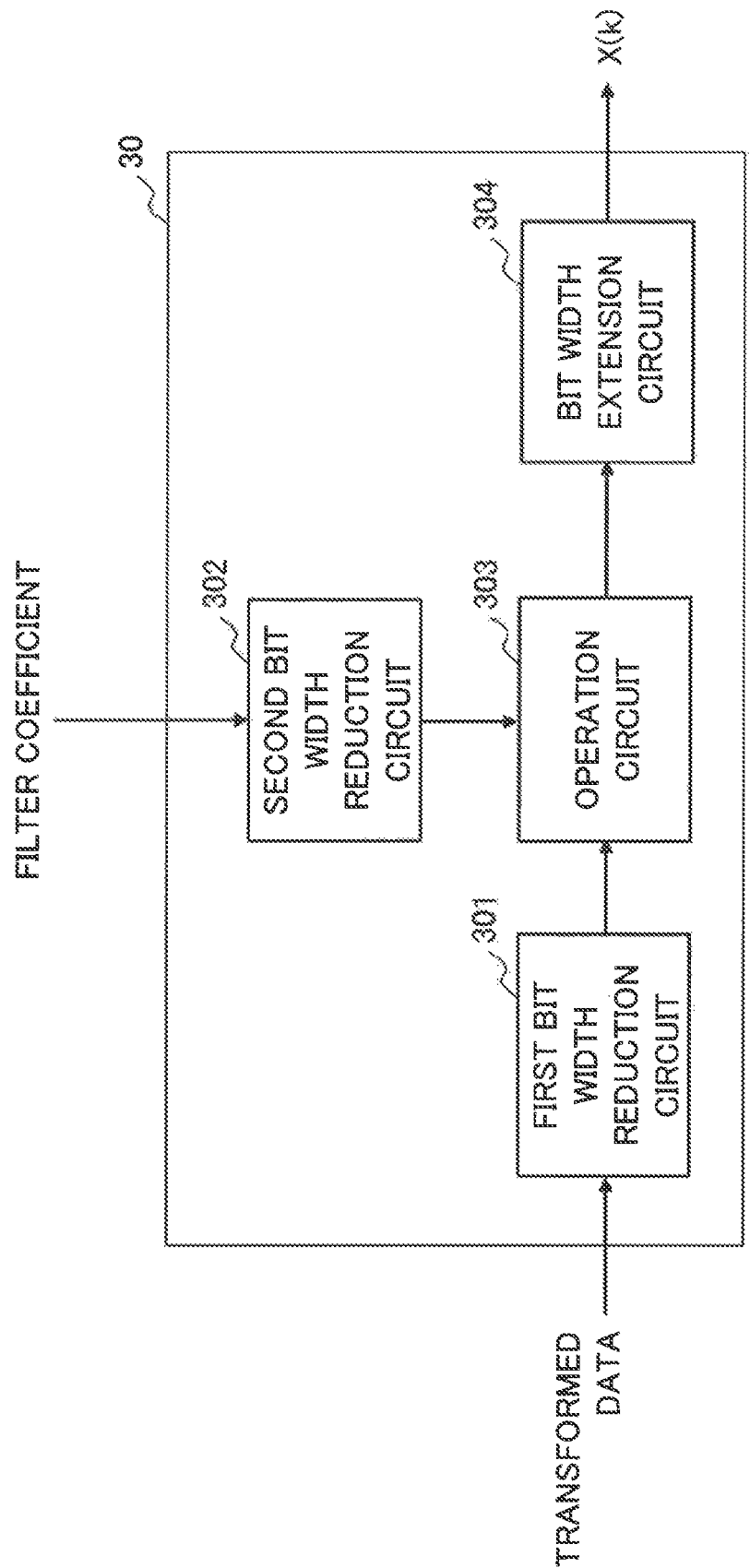
FIG. 12 is a block diagram illustrating a configuration of a filtering circuit of the digital filter device according to the third example embodiment of the present invention.

Here, a configuration of the filtering circuit 30 will be described with reference to the drawings. FIG. 12 is a block diagram illustrating a configuration of the filtering circuit 30 of the present example embodiment. As illustrated in FIG. 12, the filtering circuit 30 includes a first bit width reduction circuit 301, a second bit width reduction circuit 302, an operation circuit 303, and a bit width extension circuit 304.

The first bit width reduction circuit 301 inputs therein data which were transformed by the first transform circuit 20, and varies a bit width of data of a first frequency component among the input data. For example, the first bit width reduction circuit 301 reduces the bit width of the data of the first frequency component. For example, the first bit width reduction circuit 301 reduces the bit width of the data by using one of a cut-off process and a rounding process. The first bit width reduction circuit 301 corresponds to the configuration including the bit width reduction circuits of 310 to 317 of the first and second example embodiments.

Specifically, the first bit width reduction circuit 301 inputs therein the second data, and reduces the bit width of data among the second data.

The second bit width reduction circuit 302 reduces the bit width with respect to the filter coefficient for executing a filtering process on the data whose bit width was reduced by the first bit width reduction circuit 301. For example, the second bit width reduction circuit 302 reduces the bit width of the filter coefficient by using one of a cut-off process and a rounding process. The second bit width reduction circuit 302 corresponds to the configuration including the bit width reduction circuits 320 to 327 of the first and second example embodiments.

Specifically, the second bit width reduction circuit 302 inputs therein the filter coefficient data for executing the filtering process, and reduces the bit width of the filter coefficient corresponding to the data whose bit width was reduced by the first bit width reduction circuit 301.

The operation circuit 303 executes an operation process on each of a plurality of data including the data whose bit width was reduced in the first bit width reduction circuit 301. The operation circuit 303 includes a plurality of computing units, and executes an operation with respect to the data with the reduced bit width by using the filter coefficient with the reduced bit width. The operation circuit 303 corresponds to the configuration including the complex multipliers 330 to 337 of the first and second example embodiments.

Specifically, the operation circuit 303 executes the operation by using the second data including the data whose bit width was reduced by the first bit width reduction circuit 301, and the filter coefficient data including the filter coefficient whose bit width was reduced by the second bit width reduction circuit 302.

The bit width extension circuit 304 makes uniform the bit widths of the plural data which are output from the operation circuit 303. Specifically, the bit width extension circuit 304 makes the bit width of the data, which was reduced in the first bit width reduction circuit 301, equal to the bit widths of the other data, for example, by inserting "0" to the last part of the data. The bit width extension circuit 304 corresponds to the configuration including the bit width extension circuits 340 to 347 of the first and second example embodiments.

Specifically, the bit width extension circuit 304 extends the bit width of the data which were filtered by the operation circuit 303, among the data whose bit width was reduced by the first bit width reduction circuit 301.

As described above, according to the digital filter device of the present example embodiment, the circuit scale and power consumption can be reduced without degrading the filter performance.

(Hardware)

Figure 13:
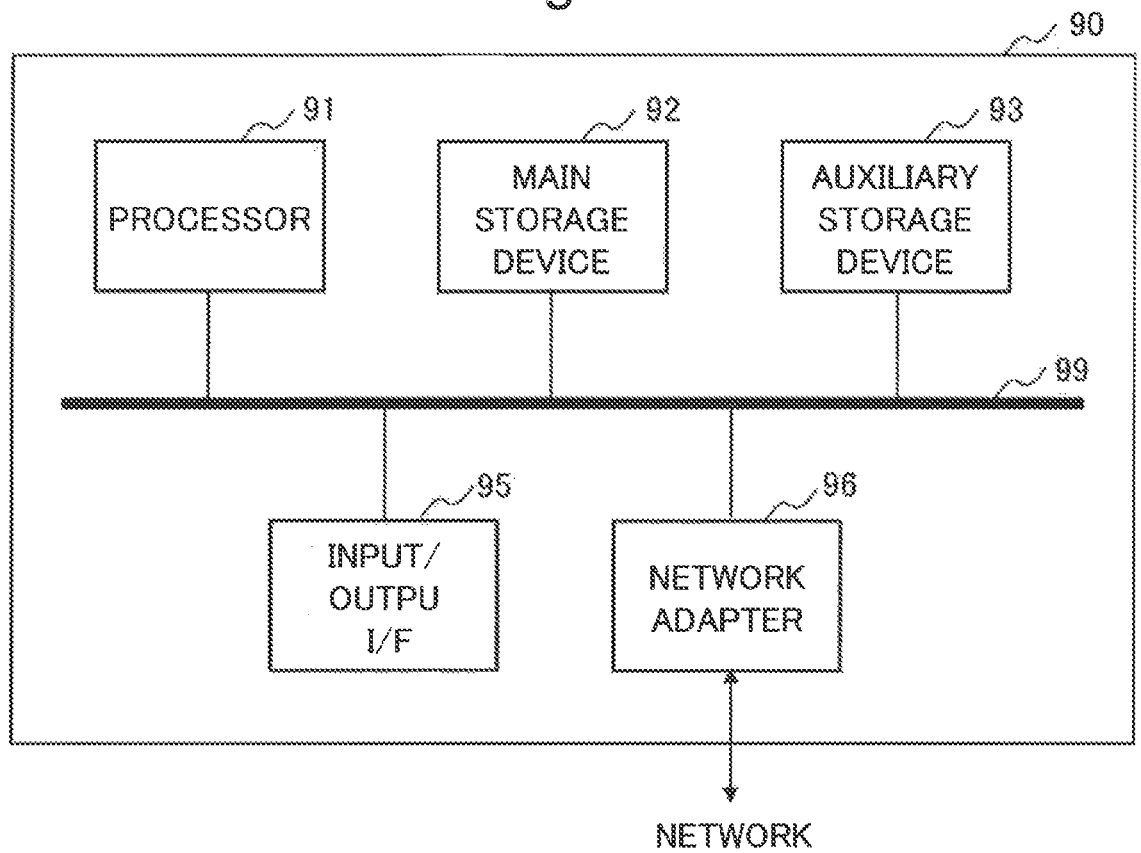
FIG. 13 is a block diagram illustrating an example of a hardware configuration for achieving the digital filter device according to each example embodiment of the present invention.

Here, referring to FIG. 13, a description is given of hardware 90 which achieves the digital filter device according to each of the present example embodiments. Note that the hardware 90 is an example for achieving the digital filter device of each of the present example embodiments, and does not restrict the scope of the present invention.

As illustrated in FIG. 13, the hardware 90 includes a processor 91, a main storage device 92, an auxiliary storage device 93, an input/output interface 95, and a network adapter 96. The processor 91, main storage device 92, auxiliary storage device 93, input/output interface 95, and network adapter 96 are interconnected via a bus 99. In addition, the processor 91, main storage device 92, auxiliary storage device 93 and input/output interface 95 are connected to a network such as an intranet or the Internet via the network adapter 96. The hardware 90 is connected to another system or device via the network. Note that each of the structural elements of the hardware 90 may be single or plural.

The processor 91 is a central processing unit configured to develop a program, which is stored in the auxiliary storage device 93 or the like, on the main storage device 92, and to execute the developed program. In the present example embodiment, the processor 91 may be configured to use a software program installed in the hardware 90. The processor 91 executes various arithmetic processes and control processes.

The main storage device 92 includes an area on which a program is developed. The main storage device 92 may be a volatile memory such as a dynamic random access memory (DRAM). In addition, a nonvolatile memory such as a magnetoresistive random access memory (MRAM) may be constituted or added as the main storage device 92.

The auxiliary storage device 93 is a means for storing various data. The auxiliary storage device 93 is constituted as a local disk such as a hard disk or a flash memory. Note that the main storage device 92 may be configured to store data, and the auxiliary storage device 93 may be omitted.

The input/output interface 95 is an interface (I/F: Interface) which connects the hardware 90 and peripheral equipment, based on connection standards.

Input equipment, such as a keyboard, a mouse or a touch panel, may be connected, as needed, to the hardware 90. Such input equipment is used to input information and settings. Note that when a touch panel is used as input equipment, a touch panel display may be adopted in which a display screen of display equipment serves also as an interface of the input equipment. Data transmission/reception between the processor 91 and input equipment may be executed via the input/output interface 95.

The network adapter 96 is an interface for a connection to a network such as the Internet or an intranet, based on standards and specifications. The input/output interface 95 and network adapter 96 may be commonly configured as an interface for a connection to external equipment.

Besides, the hardware 90 may be equipped with a reader/writer, as needed. The reader/writer is connected to the bus 99, and mediates, between the processor 91 and a recording medium (program recording medium) (not illustrated), the read of data/programs from the recording medium, and the write of processing results of the hardware 90 to the recording medium. The recording medium can be achieved by a semiconductor recording medium or the like, such as a Secure Digital (SD) card or a Universal Serial Bus (USB) memory. In addition, the recording medium may be achieved by a magnetic recording medium such as a flexible disc, or by an optical recording medium such as a Compact Disc (CD) or a Digital Versatile Disc (DVD), or by other recording media.

The above is an example of the hardware configuration for enabling the digital filter device according to each example embodiment of the present invention. Note that the hardware configuration of FIG. 13 is an example of the hardware configuration for enabling the digital filter device according to each example embodiment, and does not restrict the scope of the present invention. Furthermore, a processing program, which causes a computer to execute processing by the digital filter device according to each of the present example embodiments, is also included in the scope of the present invention. Besides, a program recording medium, which has a processing program relating to the example embodiments of the present invention recorded thereon, is also included in the scope of the present invention.

The present invention has been described above with reference to the example embodiments. The present invention, however, is not limited to the above-described example embodiments. Various changes, which are understandable to a skilled person within the scope of the present invention, can be made to the configurations and details of the present invention.

This application is based upon and claims the benefit of priority from Japanese Patent Application No. 2016-083336, filed on Apr. 19, 2016, the disclosure of which is incorporated herein in its entirety by reference.

REFERENCE SIGNS LIST

10, 11, 12 Digital filter device
20 First transform circuit
21, 22 FFT circuit
30, 31, 32 Filtering circuit
40 Second transform circuit
41, 42 IFFT circuit
211 First data rearrangement process circuit
212 First butterfly operation process circuit
213 Second data rearrangement process circuit
214 Twiddle multiplication process circuit
215 Second butterfly operation process circuit
301 First bit width reduction circuit
302 Second bit width reduction circuit
303 Multiplication circuit
304 Bit width extension circuit
310, 311, 312, 313, 314, 315, 316, 317 Bit width reduction circuit
320, 321, 322, 323, 324, 325, 326, 327 Bit width reduction circuit
330, 331, 332, 333, 334, 335, 336, 337 Complex multiplier
340, 341, 342, 343, 344, 345, 346, 347 Bit width extension circuit
411 First butterfly operation process circuit
412 First data rearrangement process circuit
413 Twiddle multiplication process circuit
414 Second butterfly operation process circuit
415 Second data rearrangement process circuit

What is claimed is:

1. A digital filter device comprising:
a first transform circuit configured to execute a first transform process on data in a predetermined frequency range;
a filtering circuit configured to execute a filtering process by setting an operation bit width of data of a preset first frequency component among the data, on which the first transform process was executed by the first transform circuit, to a different bit width from bit widths of other frequency components; and
a second transform circuit configured to execute a second transform process on the data on which the filtering process was executed by the filtering circuit,
wherein the first transform circuit is configured to input therein first data in one of first and second orders, and to output, in the second order, second data which are generated by executing the first transform process on the input first data,
the filtering circuit is configured to input therein the second data in the second order, and to output, in the second order, third data which are generated by executing the filtering process on the input second data,
the second transform circuit is configured to input therein the third data in the second order, and to output, in one of the first and second orders, fourth data which are generated by executing the second transform process on the input third data, and
the filtering circuit comprises:
a first bit width reduction circuit configured to input therein the second data, and to reduce a bit width of data among the input second data;
a second bit width reduction circuit configured to input therein filter coefficient data for executing the filtering process, and to reduce a bit width of a filter coefficient corresponding to the data whose bit width was reduced by the first bit width reduction circuit;
an operation circuit configured to execute an operation by using the second data comprising the data whose bit width was reduced by the first bit width reduction circuit, and the filter coefficient data comprising the filter coefficient whose bit width was reduced by the second bit width reduction circuit; and
a bit width extension circuit configured to extend a bit width of data on which the filtering process was executed by the filtering circuit, among the data whose bit width was reduced by the first bit width reduction circuit.

2. The digital filter device according to claim 1, wherein the filtering circuit comprises an operation circuit in which data of a frequency component, with which a specific filter characteristic is obtained even when the operation bit width of the data of the frequency component is varied, is set as the data of the first preset frequency component.

3. The digital filter device according to claim 2, wherein the filtering circuit is configured to execute the filtering process by reducing the operation bit width of the data of the first preset frequency component.

4. The digital filter device according to claim 3, wherein the filtering circuit comprises the operation circuit in which the operation bit width of the data of the first preset frequency component is set to a smaller bit width than the operation bit width of the data of the other frequency components.

5. The digital filter device according to claim 1, wherein the first transform circuit is configured to execute one of a fast Fourier transform process and an inverse Fourier transform process, and
the second transform circuit is configured to execute the inverse Fourier transform process when the first transform circuit executed the fast Fourier transform process, and configured to execute the Fourier transform process when the first transform circuit executed the inverse fast Fourier transform process.

6. The digital filter device according to claim 1, wherein the first bit width reduction circuit is configured to reduce the bit width of the data by using one of a cut-off process and a rounding process, and
the second bit width reduction circuit is configured to reduce the bit width of the filter coefficient by using one of the cut-off process and the rounding process.

* * * * *